United States Patent
Hollweg et al.

(10) Patent No.: US 10,770,906 B2
(45) Date of Patent: Sep. 8, 2020

(54) METHOD FOR TESTING A BALANCED CIRCUIT

(71) Applicant: Bayerische Motoren Werke Aktiengesellschaft, Munich (DE)

(72) Inventors: Tobias Hollweg, Shenyang/Dongling District (CN); Benno Schweiger, Munich (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 8 days.

(21) Appl. No.: 16/233,321

(22) Filed: Dec. 27, 2018

(65) Prior Publication Data

US 2019/0131798 A1    May 2, 2019

Related U.S. Application Data

(63) Continuation of application No. PCT/EP2017/069015, filed on Jul. 27, 2017.

(30) Foreign Application Priority Data

Sep. 5, 2016   (DE) ........................ 10 2016 216 775

(51) Int. Cl.
*H02J 7/00* (2006.01)
*G01R 31/396* (2019.01)
(Continued)

(52) U.S. Cl.
CPC ............ *H02J 7/0014* (2013.01); *B60L 58/22* (2019.02); *G01R 19/16542* (2013.01);
(Continued)

(58) Field of Classification Search
CPC .... H02J 7/0014; H02J 7/0021; G01R 31/382; G01R 31/396; B60L 58/22
(Continued)

(56) References Cited

U.S. PATENT DOCUMENTS

2011/0285538 A1   11/2011   Lee et al.
2012/0139553 A1    6/2012   Nortman et al.
(Continued)

FOREIGN PATENT DOCUMENTS

DE   10 2008 048 382 A1   4/2010
JP      2010-271267 A     12/2010

OTHER PUBLICATIONS

International Search Report (PCT/ISA/210) issued in PCT Application No. PCT/EP2017/069015 dated Nov. 21, 2017 with English translation (four (4) pages).
(Continued)

*Primary Examiner* — Edward Tso
*Assistant Examiner* — Aaron Piggush
(74) *Attorney, Agent, or Firm* — Crowell & Moring LLP

(57) ABSTRACT

A method tests a balancing circuit for a battery having a plurality of battery cells. The method detects first voltage states of the battery cells by way of a control unit; activates the balancing circuit with the aim of achieving a voltage equalization of at least two of the battery cells; detects second voltage states of the battery cells by way of the control unit; and determines a functional capability of the balancing circuit based on the first voltage states and the second voltage states of the battery cells by way of the control unit.

10 Claims, 3 Drawing Sheets

(51) Int. Cl.
    *G01R 31/382*    (2019.01)
    *B60L 58/22*     (2019.01)
    *G01R 19/165*    (2006.01)
    *H01M 10/48*     (2006.01)
(52) U.S. Cl.
    CPC ......... *G01R 31/382* (2019.01); *G01R 31/396* (2019.01); *H02J 7/0021* (2013.01); *H01M 10/482* (2013.01); *Y02T 10/7055* (2013.01)
(58) Field of Classification Search
    USPC ................. 320/112, 125, 134, 157, 161, 162
    See application file for complete search history.

(56) References Cited

U.S. PATENT DOCUMENTS

| | | | |
|---|---|---|---|
| 2013/0049698 A1* | 2/2013 | Jung | H02J 7/0016 320/134 |
| 2014/0253135 A1* | 9/2014 | Eguchi | G01R 35/00 324/434 |

OTHER PUBLICATIONS

German-language Written Opinion (PCT/ISA/237) issued in PCT Application No. PCT/EP2017/069015 dated Nov. 21, 2017 (six (6) pages).
German-language Search Report issued in counterpart German Application No. 102016216775.8 dated Jul. 6, 2017 with partial English translation (12 pages).

\* cited by examiner

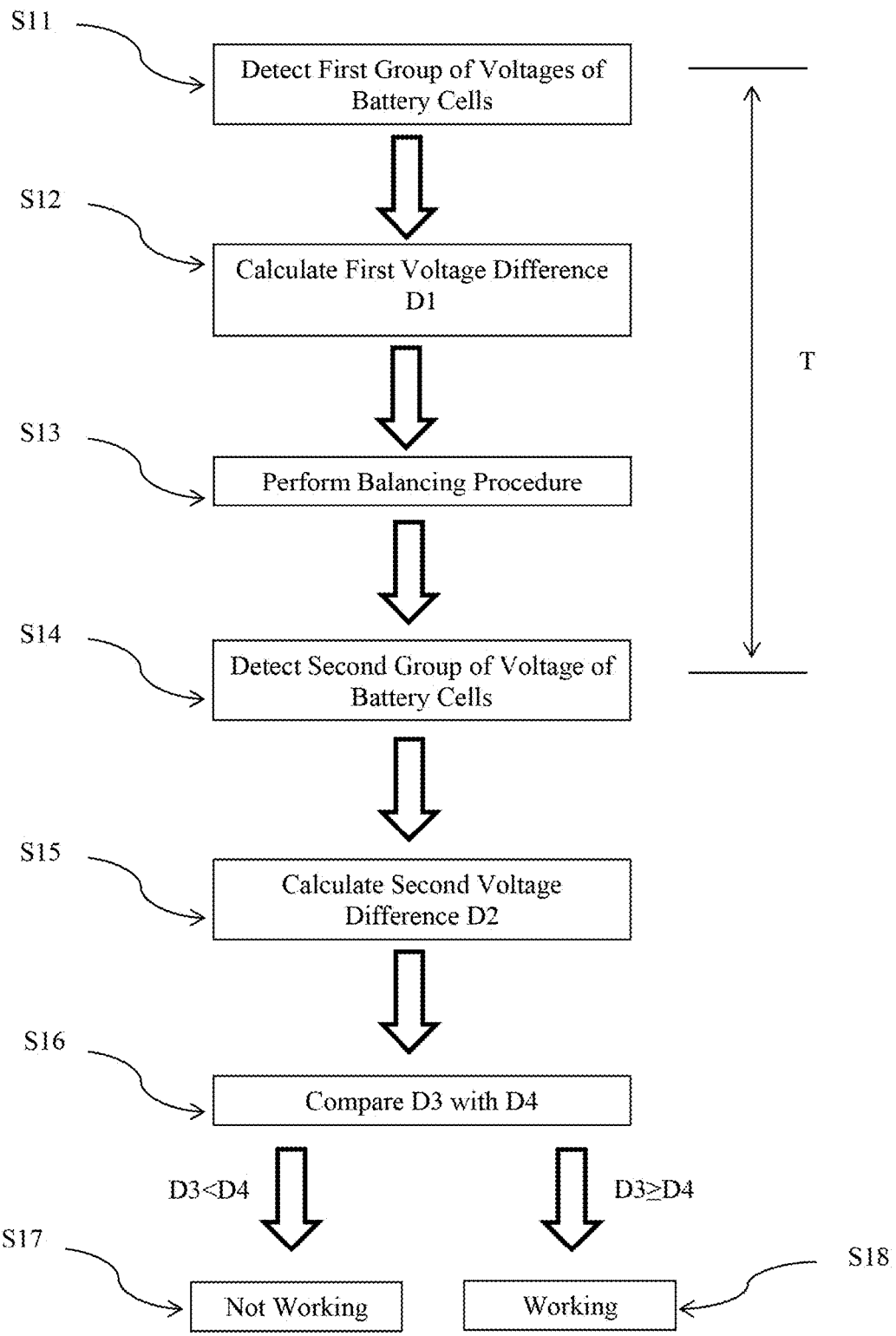

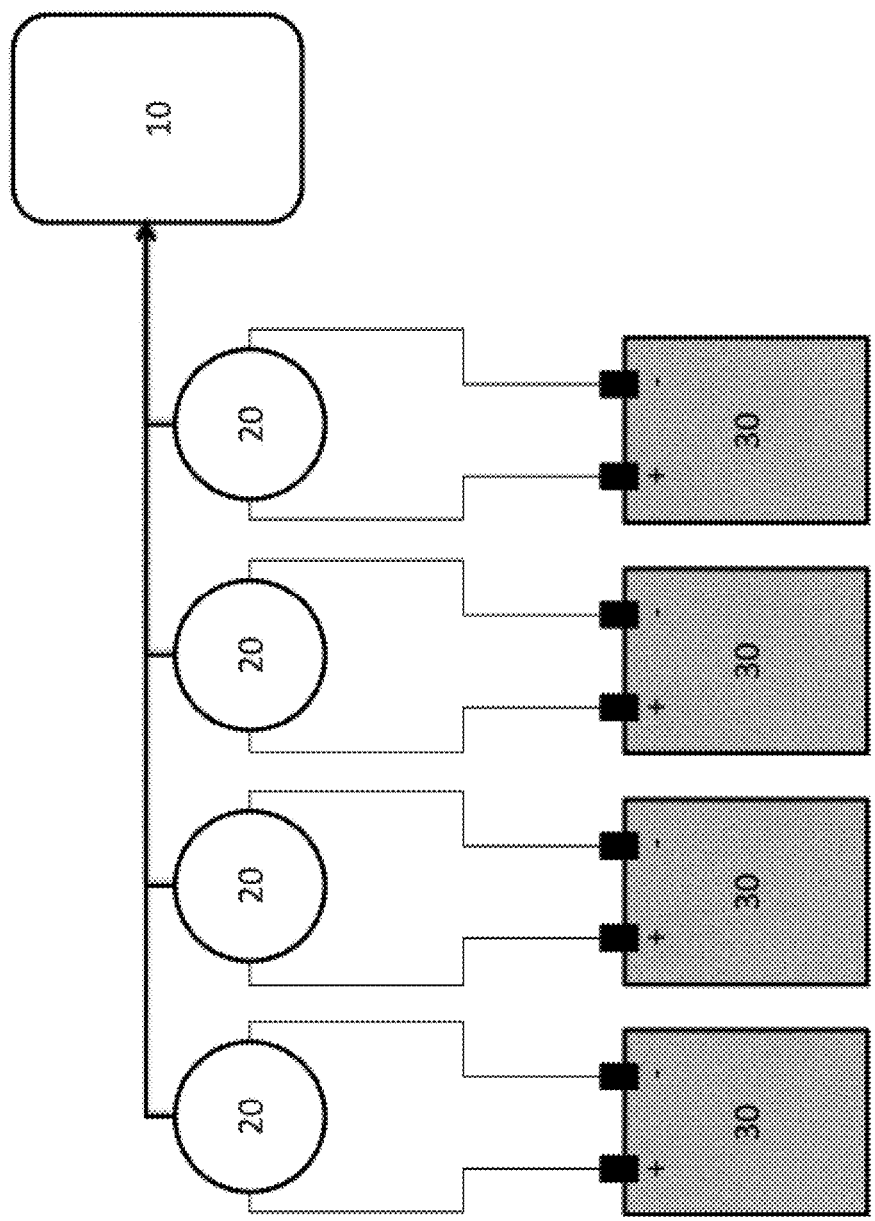

METHOD FOR TESTING A BALANCED CIRCUIT

CROSS REFERENCE TO RELATED APPLICATIONS

This application is a continuation of PCT International Application No. PCT/EP2017/069015, filed Jul. 27, 2017, which claims priority under 35 U.S.C. § 119 from German Patent Application No. 10 2016 216 775.8, filed Sep. 5, 2016, the entire disclosures of which are herein expressly incorporated by reference.

BACKGROUND AND SUMMARY OF THE INVENTION

The present invention relates to a method for testing a balancing circuit for a battery that has a plurality of battery cells, to a device for testing the balancing circuit, to a battery system, and to a vehicle.

An electric vehicle or a hybrid vehicle has a battery system (high-voltage battery) that comprises a plurality of series-connected and/or parallel-connected batteries or battery modules that each have at least two battery cells. The discharging procedure for a battery that has a plurality of battery cells is stopped as soon as that battery cell of the battery that is charged to the least extent has reached its minimum voltage, as this battery cell would suffer damage and be destroyed if discharging were to continue. Likewise, the charging procedure for a battery has to be interrupted as soon as a battery cell of the battery has reached its maximum voltage. Continuing to charge this battery cell would lead to overcharging and thus to destruction. Following an interruption of the charging procedure or of the discharging procedure, however, the other battery cells connected in series inside the battery are likewise no longer charged or discharged, even though they are possibly not yet fully charged or discharged. For this reason, the state of charge of the entire battery is restricted by the battery cell having the highest or lowest battery cell voltage. The overall capacity of the battery may therefore be greatly impaired.

Since the charging procedure for a battery is restricted by the "fullest" battery cell and the discharging procedure for the battery is restricted by the "emptiest" battery cell, a battery system normally has a balancing circuit that serves to reduce the voltage difference between the "fullest" battery cell and the "emptiest" battery cell. To test whether the balancing circuit is working correctly, the current dissipated via resistors of the balancing circuit, according to the prior art, is measured by way of current sensors. If, following activation of the balancing circuit, no current flows through the resistors, the balancing circuit should be regarded as defective. As a current sensor is required for each individual battery cell in order to monitor the resistors, the costs of the battery system are increased due to the additional costs of the current sensors.

The object of the present invention is to provide a simple method for testing a balancing circuit, which method is able to be implemented at low cost. A further object of the invention is to provide a corresponding device for testing a balancing circuit, a battery system having such a device and a vehicle having such a battery system.

This and other objects are achieved by the method, device, system and vehicle in accordance with embodiments of the invention.

The method according to the invention for testing a balancing circuit for a battery that has a plurality of battery cells comprises the following steps:
a) detecting first voltage states of the battery cells by way of a control unit,
b) activating the balancing circuit for the purpose of achieving voltage equalization of at least two of the battery cells,
c) detecting second voltage states of the battery cells by way of the control unit, and
d) determining a functional capability of the balancing circuit on the basis of the first voltage states and the second voltage states of the battery cells by way of the control unit.

The control unit detects and compares the voltage states of the battery cells prior to and following a balancing procedure. If the balancing circuit is working correctly, the voltage difference between the "fullest" battery cell and the "emptiest" battery cell is reduced following the balancing procedure. If the voltage difference has not reduced or not reduced sufficiently following the balancing procedure, the balancing circuit should therefore be regarded as defective.

According to one development of the invention, step a) includes the following steps: a1) detecting a first group of voltages of the battery cells by way of the control unit; and a2) calculating a first voltage difference between a highest voltage and a lowest voltage of the first group of voltages by way of the control unit.

According to one development of the invention, step c) includes the following steps: c1) detecting a second group of voltages of the battery cells; and c2) calculating a second voltage difference between a highest voltage and a lowest voltage of the second group of voltages by way of the control unit.

The voltages of the battery cells are preferably able to be measured by way of a voltmeter, without using additional current sensors.

According to one development of the invention, step d) includes the following steps: d1) calculating a difference value between the first voltage difference and the second voltage difference and comparing the difference value with a prescribed voltage value by way of the control unit; and d2) determining, by way of the control unit, that the balancing circuit is not working if the difference value is smaller than a prescribed voltage value.

The functional capability of the balancing circuit is determined by virtue of the fact that the balancing circuit should be regarded as defective if the voltage difference, following the balancing procedure, has not reduced or has not reduced sufficiently, that is to say for example has reduced by at least a prescribed voltage minimum value or by a prescribed percentage of the original voltage difference.

According to one development of the invention, the method comprises a further step: determining, by way of the control unit, that the balancing circuit is working if the difference value is greater than or equal to the prescribed voltage value.

According to one development of the invention, step c1) is performed a specific time after step a1).

According to one development of the invention, the specific time is determined depending on a duration of the voltage equalization; or the specific time is a prescribed value. By way of example, step c1) may be performed depending on the duration of the voltage equalization, e.g. 1-10 hours, after step a1). As an alternative, the specific time may be prescribed by the system, e.g. as 2 hours.

According to one development of the invention, the prescribed voltage value is between 0 mV and 10 mV.

The present invention furthermore provides a device for testing a balancing circuit for a battery that has a plurality of battery cells. The device comprises a control unit. The device detects first voltage states of the battery cells and activates the balancing circuit for the purpose of achieving voltage equalization of at least two of the battery cells, and detects second voltage states of the battery cells and determines a functional capability of the balancing circuit on the basis of the first voltage states and the second voltage states of the battery cells.

According to one development of the invention, the device has at least one voltmeter; wherein the at least one voltmeter detects a first group of voltages of the battery cells; and wherein the control unit calculates a first voltage difference between a highest voltage and a lowest voltage of the first group of voltages.

According to one development of the invention, the at least one voltmeter detects a second group of voltages of the battery cells; wherein the control unit calculates a second voltage difference between a highest voltage and a lowest voltage of the second group of voltages.

According to one development of the invention, the control unit calculates a difference value between the first voltage difference and the second voltage difference and compares the difference value with a prescribed voltage value, wherein the control unit determines that the balancing circuit is not working if the difference value is smaller than the prescribed voltage value.

According to one development of the invention, the prescribed voltage value D4 is between 0 mV and 10 mV.

The present invention furthermore provides a battery system. The battery system comprises at least one battery that has a plurality of battery cells, a balancing circuit whose purpose is to achieve voltage equalization of at least two of the battery cells, and an abovementioned device.

The present invention furthermore provides an electric vehicle or hybrid vehicle having the abovementioned battery system.

As the voltages of the battery cells are already measured or monitored by the battery system for other reasons, it is advantageous that no additional component or sensor is required to implement the invention. Furthermore, the function, according to the invention, of the control unit is able to be implemented in an existing controller or an existing microcontroller. The invention thus provides a solution for testing a balancing circuit without increasing the costs of the battery system. The device according to the invention moreover does not require any extra installation space for positioning the control unit.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 2 is another flow chart of another exemplary embodiment of the method according to the invention.

FIG. 3 is a schematic depiction of one exemplary embodiment of the device according to the invention.

DETAILED DESCRIPTION OF THE DRAWINGS

Figure 1:
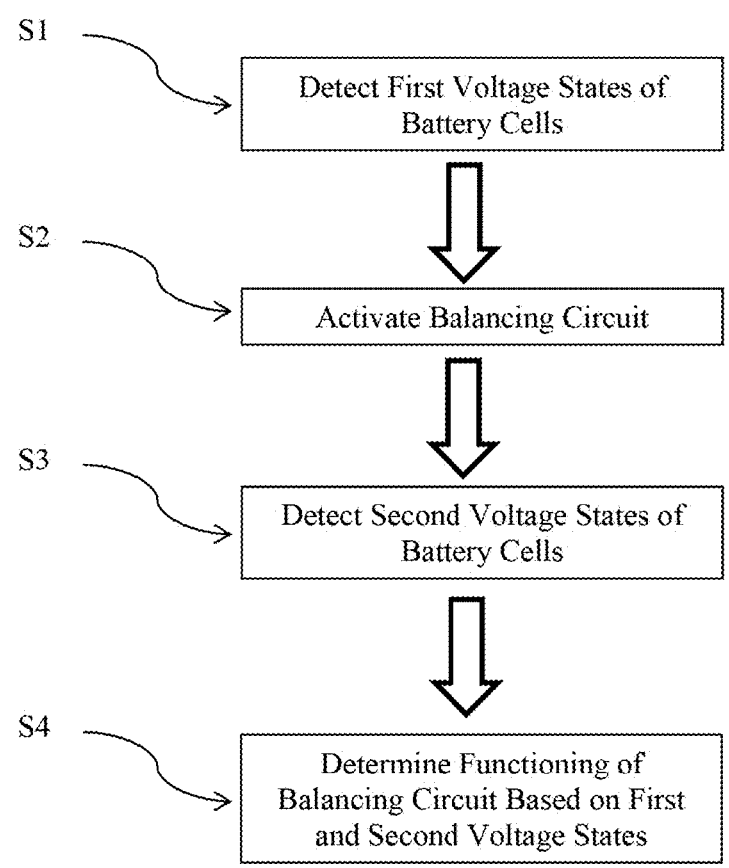
FIG. 1 is a flow chart of one exemplary embodiment of the method according to the invention.

In step S1 in FIG. 1, first voltage states of the battery cells 30 are detected by way of a control unit 10. FIG. 3 schematically depicts a device according to an embodiment of the invention or the control unit 10, which is able to implement the method in FIG. 1 or the method in FIG. 2.

Step S1 is preferably able to be implemented by step S11 and step S12 in FIG. 2. In step S11 in FIG. 2, a first group of voltages of the battery cells 30 is detected by way of e.g. at least one voltmeter.

In step S12 in FIG. 2, a first voltage difference D1 between a highest voltage and a lowest voltage of the first group of voltages is calculated by way of the control unit 10. The first voltage difference D1 indicates the voltage difference between two battery cells 30 of the plurality of battery cells 30 prior to the step of voltage equalization or of balancing of the plurality of battery cells 30.

As the voltages of the battery cells 30 are already measured or monitored by the battery system (not shown) for other reasons, no additional components or sensors are required to detect the voltages of the battery cells 30.

The balancing circuit is activated in step S2. As mentioned above, the balancing circuit has the task of achieving voltage equalization of at least two of the battery cells 30. The balancing circuit thus serves to "balance" or to equalize the states of charge of battery cells 30 of a battery system that has at least two battery cells 30. A balancing circuit is assigned to a battery cell or to a battery module and connected thereto.

The balancing procedure comprises the following method steps: acquiring the battery cell voltages; identifying a battery cell having the lowest voltage; transferring the balancing circuit of the battery cell having the lowest battery cell voltage from an active state into a sleep mode; operating the balancing circuit in the active state, which balancing circuit is connected to battery cells 30 whose battery cell voltages are in each case higher than the lowest battery cell voltage; transferring the balancing circuit operated in the active state into the sleep mode as soon as the respective battery cell voltage of the battery cells 30 respectively assigned to the balancing circuit in the active state is in each case equal to the lowest battery module voltage of the multiplicity of battery cells 30.

Second voltage states of the battery cells 30 are detected in step S3 by way of the control unit 10.

Step S3 is preferably able to be implemented by step S14 and step S15 in FIG. 2. In step S14 in FIG. 2, a second group of voltages of the battery cells 30 is detected by way of e.g. at least one voltmeter. In step S15 in FIG. 2, a second voltage difference D2 between a highest voltage and a lowest voltage of the second group of voltages is calculated by way of the control unit 10. The second voltage difference D2 indicates the greatest voltage difference between two battery cells 30 of the plurality of battery cells 30 following balancing of the plurality of battery cells 30. The second group of voltages of the battery cells 30 is detected a specific time T after the detection of the first group of voltages of the battery cells 30 or after step S11, wherein the specific time T is determined depending on a duration of the voltage equalization or balancing or is a prescribed value.

In accordance with the principle of balancing, the voltage of the battery cell that has a highest voltage prior to the balancing of the plurality of battery cells 30 is reduced by the balancing if the balancing circuit is working. Therefore, the greatest voltage difference D2 between a highest voltage and a lowest voltage of the plurality of battery cells 30 should be reduced following the balancing of the plurality of battery cells 30 if the balancing circuit is working, that is to say the second voltage difference D2 should be smaller than the first voltage difference D1.

In step S4 in FIG. 1, a functional capability of the balancing circuit is determined on the basis of the first voltage states and the second voltage states of the battery cells 30 by way of the control unit 10.

Step S4 is preferably able to be implemented by step S16 and step S17 in FIG. 2. In step S16, a difference value D3 between the first voltage difference D1 and the second voltage difference D2 is calculated using the following equation:

$$D3=D1-D2.$$

In step S16, the control unit 10 furthermore compares the difference value D3 with a prescribed voltage value D4 and determines, in step S17, that the balancing circuit is not working if the difference value D3 is smaller than a prescribed voltage value D4. The prescribed voltage value D4 is set between 0 mV and 10 mV. The prescribed voltage value D4 is preferably 4 mV.

Furthermore, in step S18 in FIG. 2, the control unit may determine that the balancing circuit is working if the difference value D3 is greater than or equal to the prescribed voltage value D4.

The control unit may evaluate the functional capability of the balancing circuit on the basis of the difference value D3 and the prescribed voltage values or ranges in graded form, e.g. "working very well", "adequate", "poor" and "defective".

The existing controller or microcontroller inside the battery system may serve as the control unit. This leads to no additional expenditure. The present invention thus provides a solution for testing a balancing circuit without increasing the costs of the battery system.

FIG. 3 shows a schematic depiction of a device that is able to test a balancing circuit for a battery that has a plurality of battery cells 30. The device comprises a control unit 10 and a plurality of voltmeters 20, wherein the device detects first voltage states of the battery cells 30 and activates the balancing circuit (not shown) for the purpose of achieving voltage equalization of at least two of the battery cells 30, and detects second voltage states of the battery cells 30, and determines a functional capability of the balancing circuit on the basis of the first voltage states and the second voltage states of the battery cells 30.

The voltmeters 20 serve to measure the voltages of the battery cells 30. The control unit 10 calculates a first voltage difference D1 between a highest voltage and a lowest voltage of the battery cells 30 prior to the balancing step, and a second voltage difference D2 between a highest voltage and a lowest voltage of the battery cells 30 following the balancing. As the voltages of the battery cells 30 are already measured or monitored by the battery system for other reasons, the voltmeters are already present inside a battery system. No additional components are therefore required to measure the voltages of the battery cells 30.

The control unit 10 calculates a difference value D3 between the first voltage difference D1 and the second voltage difference D2 and compares the difference value D3 with a prescribed voltage value D4. The control unit 10 determines that the balancing circuit is not working if the difference value D3 is smaller than a prescribed voltage value D4. On the other hand, the balancing circuit is working if the difference value D3 is greater than or equal to the prescribed voltage value D4.

A controller that is already present or a microcontroller that is already present in the battery system may serve as the control unit. This therefore leads to no additional expenditure. The present invention thus provides a solution for testing a balancing circuit without increasing the costs of the battery system. As no additional components need to be used, the installation space for the battery system remains unchanged.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for testing a balancing circuit for a battery that has a plurality of battery cells, the method comprising the steps of:
   a) detecting first voltage states of the battery cells by way of a control unit, including:
      a1) detecting a first group of voltages of the battery cells; and
      a2) calculating a first voltage difference between a highest voltage and a lowest voltage of the first group of voltages by way of the control unit;
   b) activating the balancing circuit for a purpose of achieving voltage equalization of at least two of the battery cells;
   c) detecting second voltage states of the battery cells by way of the control unit, including:
      c1) detecting a second group of voltages of the battery cells; and
      c2) calculating a second voltage difference between a highest voltage and a lowest voltage of the second group of voltages by way of the control unit; and
   d) determining, by way of the control unit, a functional capability of the balancing circuit on the basis of the first voltage states and the second voltage states of the battery cells, including:
      d1) calculating a difference value between the first voltage difference and the second voltage difference and comparing the difference value with a prescribed voltage value by way of the control unit and
      d2) determining, by way of the control unit, that the balancing circuit is not working if the difference value is smaller than a prescribed voltage value.

2. The method as claimed in claim 1, wherein the method further comprises the step of:
   determining, by way of the control unit, that the balancing circuit is working if the difference value is greater than or equal to the prescribed voltage value.

3. The method as claimed in claim 1, wherein step c1) is performed a specific time after step a1).

4. The method as claimed in claim 3, wherein
   the specific time is determined depending on a duration of the voltage equalization; or
   the specific time is a prescribed value.

5. The method as claimed in claim 1, wherein the prescribed voltage value is between 0 mV and 10 mV.

6. The method as claimed in claim 2, wherein the prescribed voltage value is between 0 mV and 10 mV.

7. A device for testing a balancing circuit for a battery that has a plurality of battery cells, comprising:
   a control unit operatively configured to execute a process that:
      detects first voltage states of the battery cells;
      activates the balancing circuit for a purpose of achieving voltage equalization of at least two of the battery cells;
      detects second voltage states of the battery cells; and determines a functional capability of the balancing circuit on the basis of the first voltage states and the second voltage states of the battery cells; and at least one voltmeter, wherein the at least one voltmeter detects a first group of voltages of the battery cells;

the control unit calculates a first voltage difference between a highest voltage and a lowest voltage of the first group of voltages;

the at least one voltmeter detects a second group of voltages of the battery cells;

the control unit calculates a second voltage difference between a highest voltage and a lowest voltage of the second group of voltages;

the control unit calculates a difference value between the first voltage difference and the second voltage difference and compares the difference value with a prescribed voltage value; and the control unit determines that the balancing circuit is not working if the difference value is smaller than the prescribed voltage value.

8. The device as claimed in claim 7, wherein the prescribed voltage value is between 0 mV and 10 mV.

9. A battery system, comprising:

at least one battery that has a plurality of battery cells;

a balancing circuit whose purpose is to achieve voltage equalization of at least two of the battery cells; and a device for testing the balancing circuit as claimed in claim 7.

10. An electric vehicle or hybrid vehicle, comprising a battery system as claimed in claim 9.

* * * * *